United States Patent
Cappuzzo et al.

(10) Patent No.: US 6,611,001 B2
(45) Date of Patent: Aug. 26, 2003

(54) LASER PACKAGE

(75) Inventors: Mark Anthony Cappuzzo, Succasunna, NJ (US); John Van Atta Gates, II, New Providence, NJ (US); Louis T. Gomez, North Plainfield, NJ (US); Gerard Edmond Henein, Chatham, NJ (US); Isaac Ryazansky, New Providence, NJ (US); Joseph Shmulovich, Murray Hill, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 17 days.

(21) Appl. No.: 09/777,934

(22) Filed: Feb. 6, 2001

(65) Prior Publication Data

US 2002/0105979 A1 Aug. 8, 2002

(51) Int. Cl.[7] ................................................. H01L 33/00
(52) U.S. Cl. ............................. 257/81; 257/98; 257/99; 385/92; 385/94
(58) Field of Search .............................. 257/80, 81, 82, 257/98, 99; 385/88, 89, 92, 94; 372/50

(56) References Cited

U.S. PATENT DOCUMENTS

| 5,291,572 | A | * | 3/1994 | Blonder et al. ................ 385/94 |
| 5,412,748 | A | * | 5/1995 | Furuyama et al. ............ 385/92 |
| 5,608,744 | A | | 3/1997 | Hovis et al. ................... 372/21 |
| 5,727,104 | A | * | 3/1998 | Sasaki et al. .................. 385/94 |
| 5,754,575 | A | | 5/1998 | Sukhman et al. ............. 372/36 |
| 5,982,803 | A | | 11/1999 | Sukhman et al. ............. 372/87 |
| 6,084,895 | A | | 7/2000 | Kouchi et al. ................. 372/36 |
| 6,282,350 | B1 | * | 8/2001 | Takahashi et al. ............ 385/88 |

* cited by examiner

Primary Examiner—Minh Loan Tran (57) ABSTRACT

A compact laser package having a submount with a plurality of electrical contact pads and a plurality of electrical connection lines formed thereon. The submount may be configured to receive at least one optical component thereon, the at least one optical component being in electrical communication with at least one of the plurality of electrical connection lines. A lid is provided, the lid having a recessed portion and a groove formed therein, the recessed portion being positioned in an interior of the lid and the groove being positioned to intersect the recessed portion and a peripheral edge of the lid. The submount is generally configured to cooperatively engage the lid to form a hermetically sealed laser package.

18 Claims, 8 Drawing Sheets

FIG. 1
PRIOR ART
LaserPAC

LASER PACKAGE

BACKGROUND OF THE INVENTION

1. Field of the Invention

The present invention relates to laser packages. More particularly, the present invention relates to hermetically sealed miniature laser packages.

2. Background of the Related Art

Figure 1:
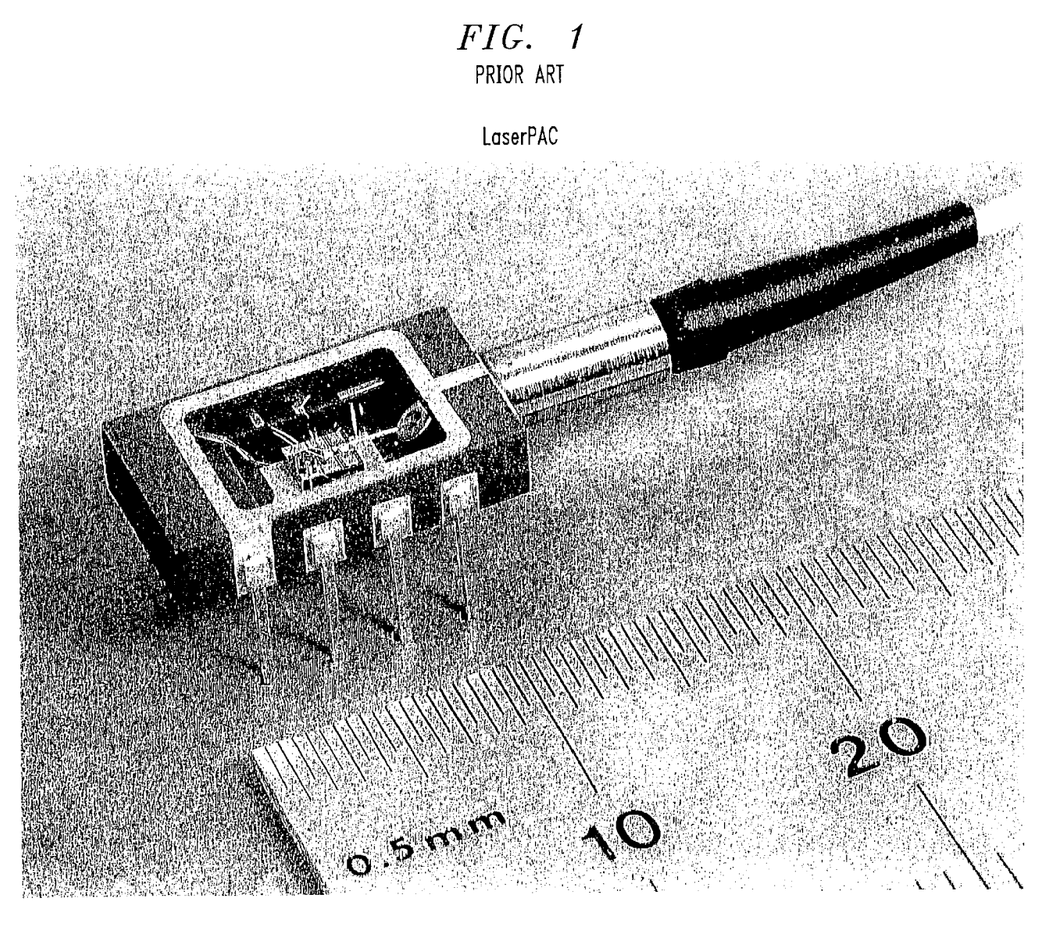
FIG. 1 illustrates a conventional laser package.

Conventional laser packages are generally manufactured from either kovar or alumina and are extremely large and/or bulky, often over 15 mm×7 mm×7 mm, when compared to the size of the actual optical emission components within the laser package. Kovar based package configurations suffer from difficulty in affixing electrical connections to the package, as attachment of electrical pads generally requires a glass to metal-type weld, which is difficult to successfully repeat with efficiency. Ceramic-type packages, such as alumina, suffer from similar disadvantages, as the electrical connection pads are generally be brazed on the ceramic packaging material, which is again a relatively difficult process to efficiently and successfully repeat. Further, conventional packaging schemes, an example of which is shown in FIG. 1, require either insertion of the conventional laser package into a matching receiving component or hand soldering of the respective leads to an electronic board in order to secure the laser package for operation. As such, the application of conventional laser packages is directly limited by both the availability of mounting hardware as well as the physical space that is available to receive the conventional laser package. In view of current downsizing trends in the electronics industry, the availability of sufficient physical mounting space for conventional laser packages is becoming an increasing problem. Further, there is a substantial cost associated with the production of the sizable packaging configurations as a result of the cost of materials such as alumina and kovar. Additionally, the associated mounting hardware used with conventional laser packages imposes both cost and space restraints.

Therefore, in view of the clear disadvantages relative to conventional laser packages, there exists a need for a laser device in a compact package that can be manufactured with minimal cost, wherein the compact laser package provides a versatile mounting configuration that facilitates mounting in downsized electronic components.

SUMMARY OF THE INVENTION

The present invention provides a compact laser package having a submount with a plurality of electrical contact pads and a plurality of electrical connection lines formed thereon. The submount may be configured to receive at least one optical component thereon, the at least one optical component being in electrical communication with at least one of the plurality of electrical connection lines. A lid is provided, the lid having a recessed portion and a groove formed therein, the recessed portion being positioned in an interior of the lid and the groove being positioned to intersect the recessed portion and a peripheral edge of the lid. The submount is generally configured to cooperatively engage the lid to form a hermetically sealed laser package.

The present invention further provides a miniature apparatus for generating laser light including a silicon submount member, a silicon lid member, and at least one optical signal generation component positioned on the silicon submount member. An optical transmission medium may be affixed to the silicon submount member, the optical transmission medium being configured to communicate a laser signal generated by the at least one optical signal generation component. The plurality of the silicon submount members and a plurality of the silicon lid members may be manufactured from a silicon wafer.

The present invention further provides a method for manufacturing a compact laser package including the steps of determining the location of a plurality of submount members on a first silicon wafer, depositing predetermined metallization layers on the plurality of submount members, and dicing each of the plurality of submount members from the first silicon wafer. The method further includes positioning optical components on individual submount members, determining the location of a plurality of lid members on a second silicon wafer, and depositing predetermined metallization layers on the plurality of lid members. The plurality of lid members may be diced from the second silicon wafer, and lid members then affixed to the individual submount members to form the compact laser package.

The present invention further provides a compact laser package having a means for determining the location of a plurality of submount members on a first silicon wafer and a means for depositing predetermined metallization layers on the plurality of submount members. A means for dicing each of the plurality of submount members from the first silicon wafer is provided, and a means for positioning optical components on individual submount members is provided. A means for determining the location of a plurality of lid members on a second silicon wafer and a means for depositing predetermined metallization layers on the plurality of lid members are included. A means for dicing each of the plurality of lid members from the second silicon wafer and a means for affixing each of the plurality of lid members to individual submount members to form the compact laser package are provided.

BRIEF DESCRIPTION OF THE DRAWINGS

So that the manner in which the above recited features, advantages and objects of the present invention may be understood in detail, a more particular description of the invention briefly summarized above may be had by reference to the embodiments thereof, which are illustrated in the appended drawings. It is to be noted, however, that the appended drawings illustrate only exemplary embodiments of the invention, and are therefore, not to be considered limiting of its scope, as the invention may admit to alternative equally effective embodiments not expressly illustrated by the drawings.

DETAILED DESCRIPTION OF THE PREFERRED EMBODIMENT

Figure 2:
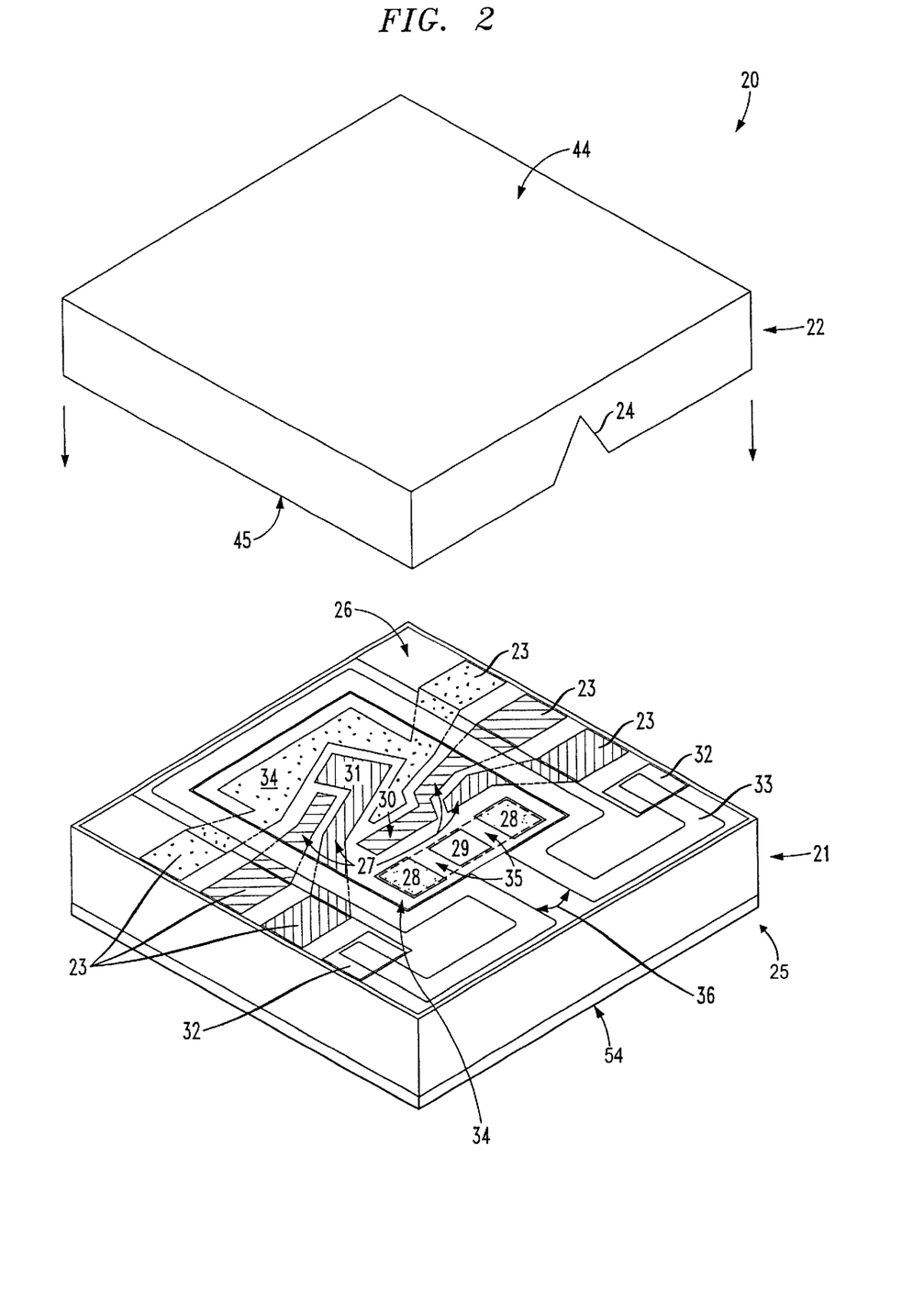
FIG. 2 illustrates an exemplary laser package of the present invention.

An exemplary compact laser package 20 of the present invention is illustrated in FIG. 2. Compact laser package 20 generally includes a lower submount portion 21 and an upper lid portion 22. Submount 21 and lid 22 cooperatively form laser package 20 having a hollow interior portion (not shown) where optical components may be placed. The hollow interior portion is in communication with the exterior of laser package 20 through a groove 24 formed in lid 22. Therefore, an optical signal generated within the hollow interior portion may be communicated to the exterior of laser package 20 via an optical fiber or other optical transmission medium positioned in groove 24.

Figure 3:
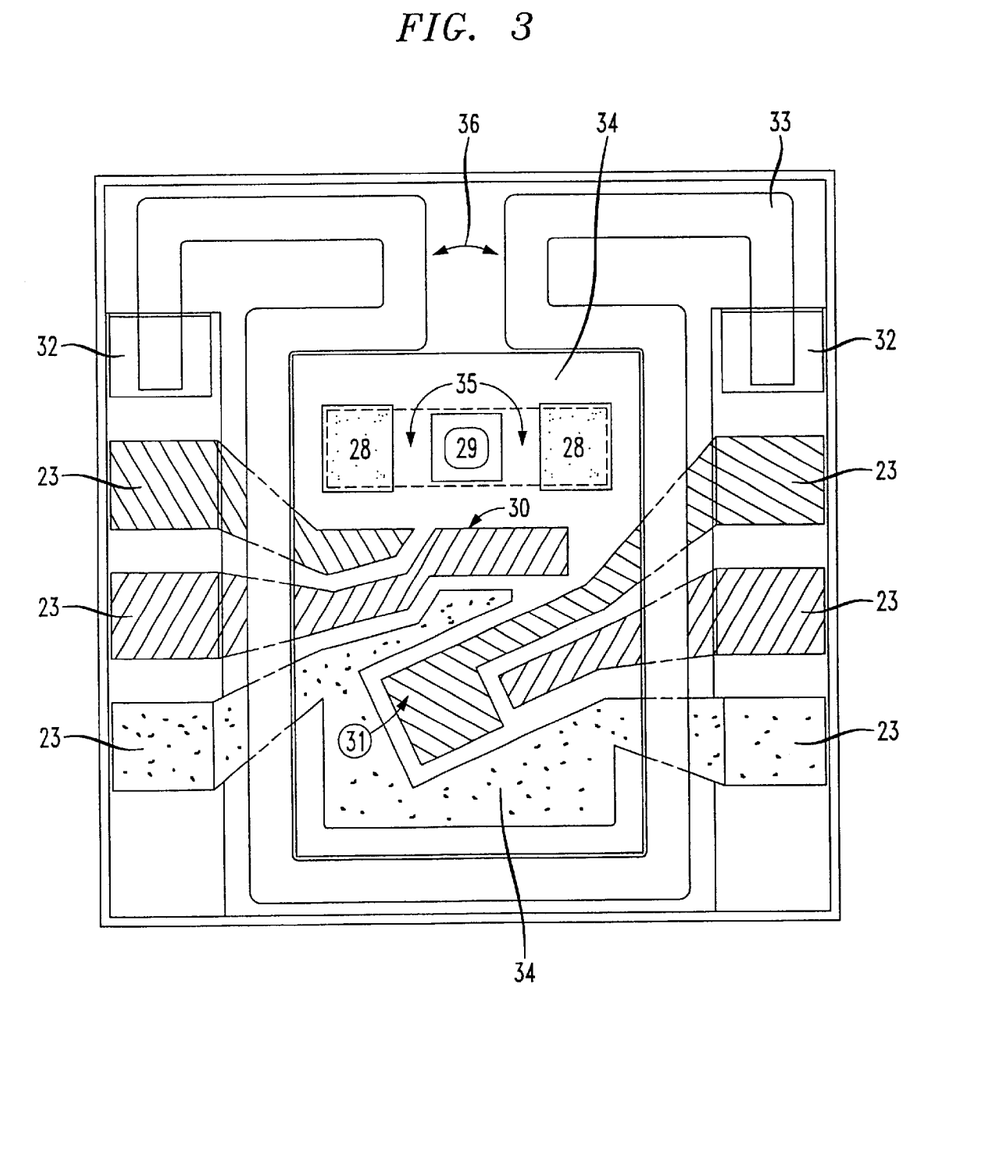
FIG. 3 illustrates an exemplary submount of the present invention without optical components installed thereon.

Submount 21, which is individually detailed in FIG. 3, may be manufactured from a silicon material, such as common silicon wafer. The lower base portion 25 of submount 21 may be metallized 54 in order to facilitate connection to various electronic components without requiring a dedicated receptacle, as with conventional packages. The upper portion 26 of submount 21 is configured to receive the optical hardware and electrical connection devices necessary to generate the desired optical signal. Additionally, upper portion 26 may include a first strip heater 33 configured to facilitate a soldering function used to hermetically seal submount 21 to lid 22 after installation of the optical hardware. Strip heater 33, which is manufactured into submount 21, may have an overlay of a metallization layer, which may be used to solder lid 22 thereto, as discussed herein. A second strip heater 35 may be positioned between two interior connection pads 28 and routed underneath a fiber mounting location 29, which may also be used to facilitate a soldering function.

The periphery of submount 21 includes a plurality of electrical connection pads 23. Electrical connection pads 23 are generally positioned about the periphery of submount 21 in order to remain accessible after lid 22 is soldered to upper portion 26 of submount 21. Each of electrical connection pads 23 are generally in communication with an electrically conductive line 27, which operates to conduct electrical energy to/from a connection made with electrical connection pad 23 to an internal component of laser package 20. Electrical connection pads 23 and lines 27 may be formed by known etching and/or metal depositing techniques, or other technique used for depositing and/or positioning electrically conductive materials. However, in view of the multiple electrical connection lines and the intersection of these lines with other components of submount 21, the metal depositing technique generally includes a multilayer insulator/conductor configuration, such that the various connections may intersect without being in electrical communication. Additionally, heaters 33 and 35 are generally formed into submount 21 prior to the metallization process, as it is desired that these components be positioned below the electrical connections formed by the metallization process, as heaters 33 and 35 may be used to selectively heat metallized layers positioned above in order to facilitate a soldering process.

The interior of submount 21 includes a component placement area 34, which is generally defined as the area encompassed by heater strip 33, as shown in FIG. 3. The component placement area 34 may include a location for mounting a laser light emission additional components. Selected electrically conductive lines 27 may be routed proximate and/or directly under the laser mounting location 30 and the photodetector mounting location 31 in order to facilitate electrical connection to the respective components. An additional set of connection pads 32 positioned about the periphery of submount 21 may be used to conduct electrical energy to strip heater 33. Connection pads 32 and 33 are generally manufactured from an electrically conductive material, such as gold or copper, that readily accepts soldering and/or other types of electrical connections thereto.

Placement area 34 additionally includes a pair of electrically conductive pads 28 positioned proximate an optical fiber attachment location 29. Optical fiber attachment location 29, which is generally a metallized pad or region, may be used to affix an optical transmission medium thereto for communicating an optical signal generated in placement area 34 by a laser positioned at location 30 to the exterior of laser package 20. In order to facilitate attachment of the optical fiber to the attachment location 29, a second heater strip 35 may be placed between conductive pads 28 and routed proximate, preferably underneath, location 29. As such, an optical fiber may be placed on attachment location 29 at the working distance from a laser placed on laser mounting position 30, and second heater strip 35 may be activated in order to melt solder between the optical fiber and the attachment location 29. Activation of second strip heater 35 may be through application of an electrical potential across the respective pads 28, which in turn circulates an electrical current through second heater strip 35. Once the solder has melted, the electrical voltage to heater 35 may be discontinued and the solder and heater allowed to cool. Upon cooling, the optical fiber will be soldered in place for operation.

First heater strip 33, which is generally in electrical communication with pads 32, may define the outer periphery of component placement area 34. First heater strip 33 is generally formed into submount 21 prior to the formation of pads 32 and electrically conductive lines 27. As such, first strip heater 33 essentially underlays lines 27 and the metallized layer outlining the layout of heater 33. Further, heater 33 and the overlaid metallized layer that may be used for soldering lid 22 thereto essentially surround component placement area 34. However, as shown in FIG. 3, first heater strip 33 may be routed around a channel 36 leading from the periphery of submount 21 to the component placement area 34 in the interior portion of submount 21. Channel 36 may be used to communicate an optical transmission medium from the component placement area 34 to the outer edge of submount 21. In particular, channel 36 in cooperation with a groove 24 formed in lid 22, may be used to communicate an optical fiber attached to the fiber attachment location 29 to the exterior of submount 21.

Figure 4:
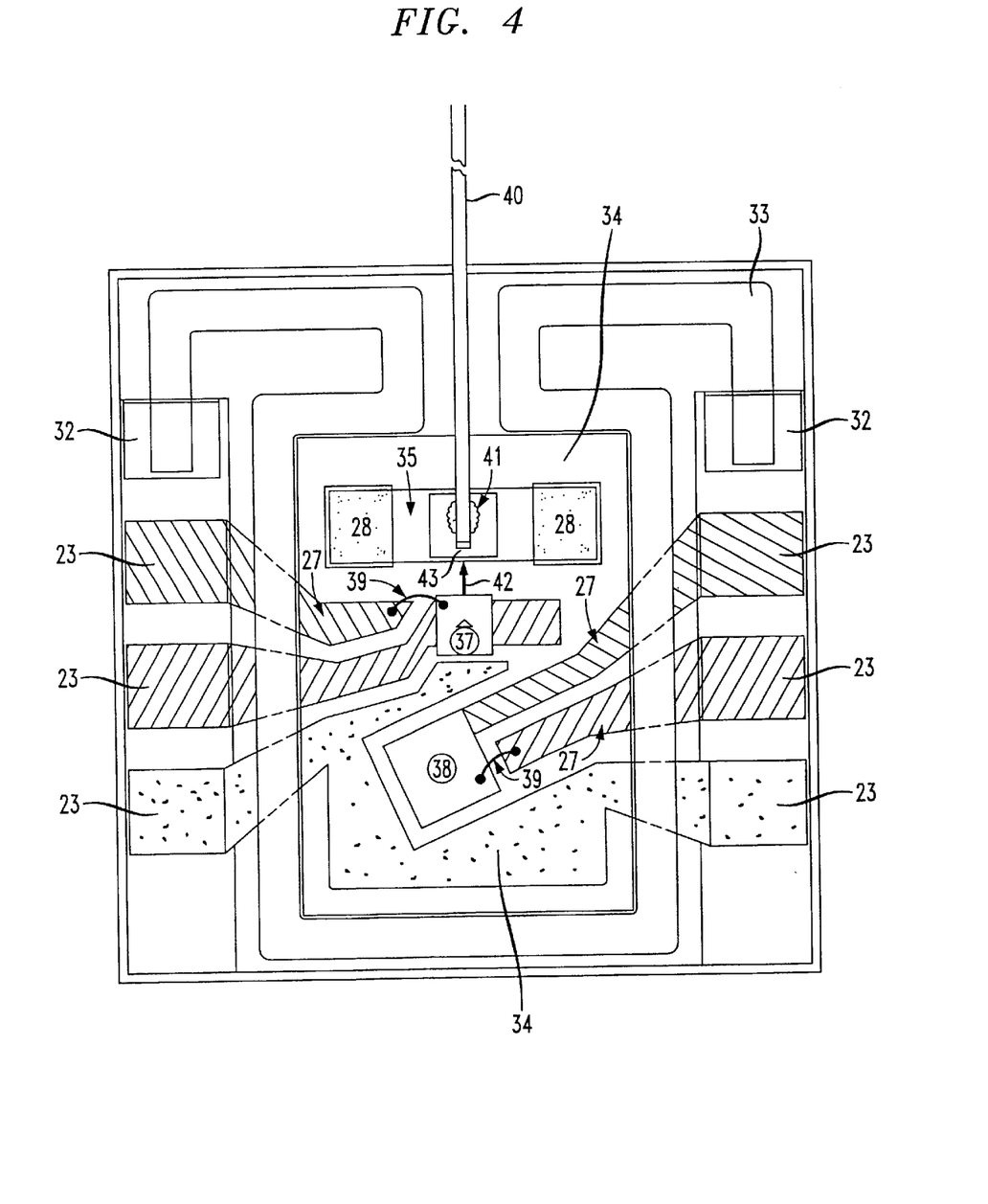
FIG. 4 illustrates an exemplary submount of the present invention with optical components installed thereon.

An optical component that may be used to generate the optical signal from laser package 20 may include a laser light generating device 37, which may be positioned on laser mounting location 30, as shown in FIG. 4. Laser light emitting device 37 may include a metallized under surface that is in communication with a first electrical connection of light emitting device 37. In this situation, laser light emitting device 37 may simply be positioned on location 30, which may be in communication with line 27. As such, laser light emitting device may receive electrical current via line 27 through location 30 and the metallized under surface of laser light emitting device 37. Alternatively, if the under surface of light emitting device 37 is not metallized, a jumper 39 may be installed from the first connection of light emitting device to line 27. A second electrical connection to light emitting device will generally require attachment of an electrical jumper 39 to another of lines 27 positioned proximate thereto in order to complete an electrical circuit through light emitting device 37, as shown in FIG. 4. Another optical component that may be used in the generation of the optical signal is photo detector 38. Detector 38 may be positioned on location 31 and electrically connected in a similar manner to laser light source 37. In order to conduct an optical signal generated by laser light device 37 to the exterior of laser package, an optical fiber 40 may be affixed to laser package 20. In particular, during assembly of laser package 20, fiber 40 may be attached to fiber mounting location 29. The exact location of the mounting of fiber 40 will be determined by the position of laser light emitting device 37, as fiber 40 is generally positioned at a working distance from laser light source 37 in order to receive light emitted from laser light source 37 in a receiving end 43 of fiber 40. Receiving end may include a collimating lens integrally formed into the terminating end of fiber 40. Therefore, generally after the laser light source 37 is installed, laser light source 37 is activated and fiber 40 is brought into position proximate laser light source 37. When the optimal position of fiber 40 is determined, wherein the optimal position may be defined as the position at which receiving end 43 receives the maximum amount of light emitted 42 from light source 37, then an electrical voltage may be applied across pads 28. The application of a voltage to pads 28, which are in electrical communication with second strip heater 35, operates to increase the temperature of second strip heater 35. Since second strip heater 35 is generally routed between pads 28 and under fiber mounting location 29, the increased temperature of second strip heater 35 may be calculated to melt a portion of solder 41 placed on fiber mounting location 29 prior to fiber 40 being positioned thereon. As such, when solder 41 melts, the voltage may be discontinued and solder 41 allowed to cool with fiber 40 appropriately positioned. When solder 41 cools, fiber 40, which generally has a metallized outer surface, will remain optimally positioned and will be affixed in place via solder 41. Fiber 40 may be a rigid optical transmission fiber, a semi-flexible fiber, or other known optical transmission medium. Additionally, although soldering is disclosed as the method for affixing fiber 40 to location 29, other methods may be used to affix fiber 40 to location 29, such as epoxy, for example.

Figure 5:
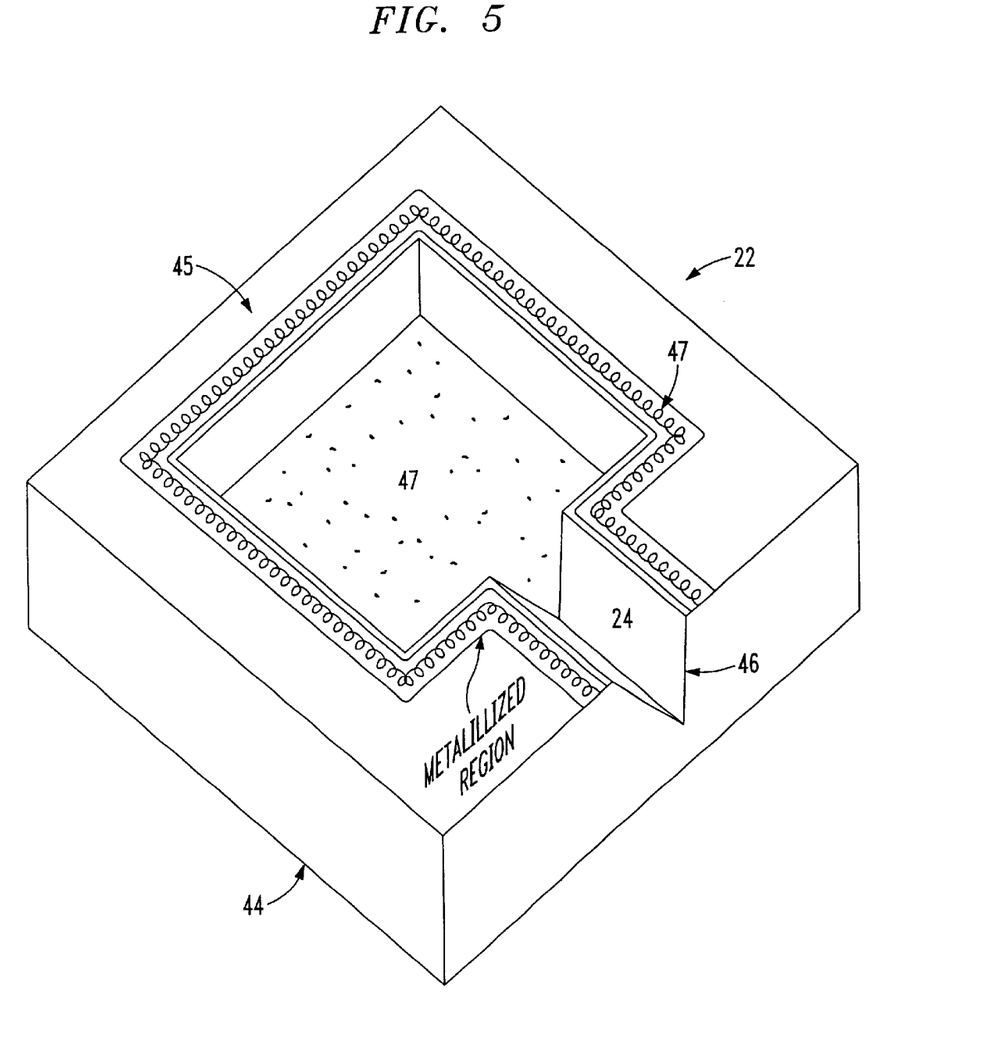
FIG. 5 illustrates an exemplary lid portion of the present invention.

FIG. 5 illustrates an exemplary lid 22 of the present invention. Lid 22 includes an upper side 44 and an under side 45. The upper side 44 is generally exposed to the ambient atmosphere upon assembly of laser package 20, while under side 45 is generally in engagement with upper side 26 of submount 21. Under side 45 includes a recessed portion 47 that intersects groove 24 shown in FIG. 2. Recessed portion 47 may be formed by an etching process or by other chemical and/or mechanical devices or processes configured to remove material from stock material used to manufacture lid 22. In the present exemplary embodiment, lid 22 and submount 21 are manufactured from a silicon wafer, and therefore, an etching process may be used to form recessed portion 47 and groove 24. A metallized region generally surrounding recessed portion 47 may be formed, and a continuous bead of solder 47 may be placed about the perimeter of recessed portion 47 on the metallized layer for use in attaching/soldering submount 21 to lid 22, which will be further discussed herein.

As shown in FIG. 5, groove 24 generally connects the cavity formed by recessed portion 47 with the ambient air outside laser package 20. As such, when lid 22 is affixed to submount 21, groove 24 terminates in a triangular aperture 46 formed by the edges of groove 24 and the edge of upper portion 26 of submount 21. Aperture 46 in cooperation with groove 24, therefore, may conduct fiber 40 from the interior of laser package 20 to the ambient air. However, since laser package 20 is generally configured to be a hermetically sealed package, as will be discussed below, the space around fiber 40 within groove 24 may be filled with solder, epoxy, or other fill substance in order to prevent ambient air from entering the interior portion of laser package 20.

Figure 6:
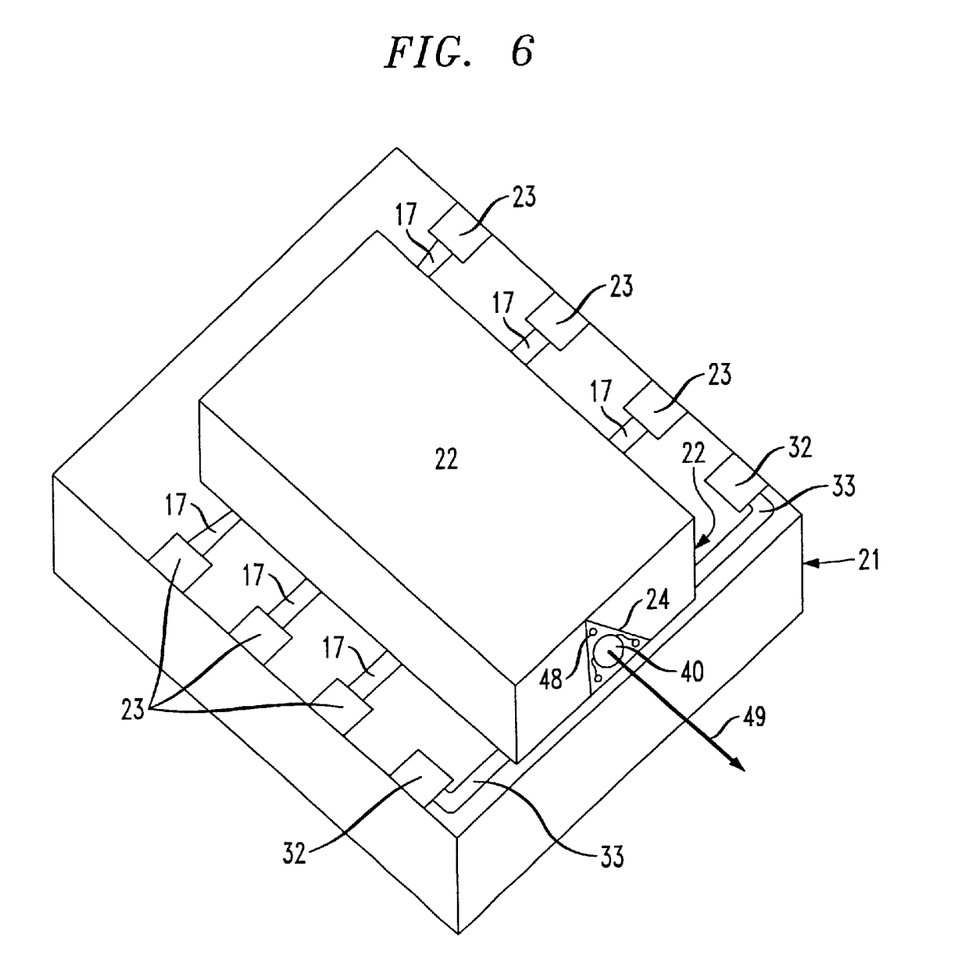
FIG. 6 illustrates an additional exemplary embodiment of the present invention.

In another embodiment of laser package 20, a length of fiber 40 may be calculated to not extend past the exterior of submount 21, as shown in FIG. 6. In this exemplary embodiment, fiber 40 extends to the terminating edge of submount 21 and terminates proximate thereto, which releases the laser light generated by optical laser light source 37 into the ambient atmosphere. The area surrounding fiber 40 within groove 24 and inside aperture 46 may again be filled with solder, epoxy, or other fill substance in order to hermetically seal laser package 20. The laser light released from the shortened fiber 40 is shown by arrow 49.

Figure 7:
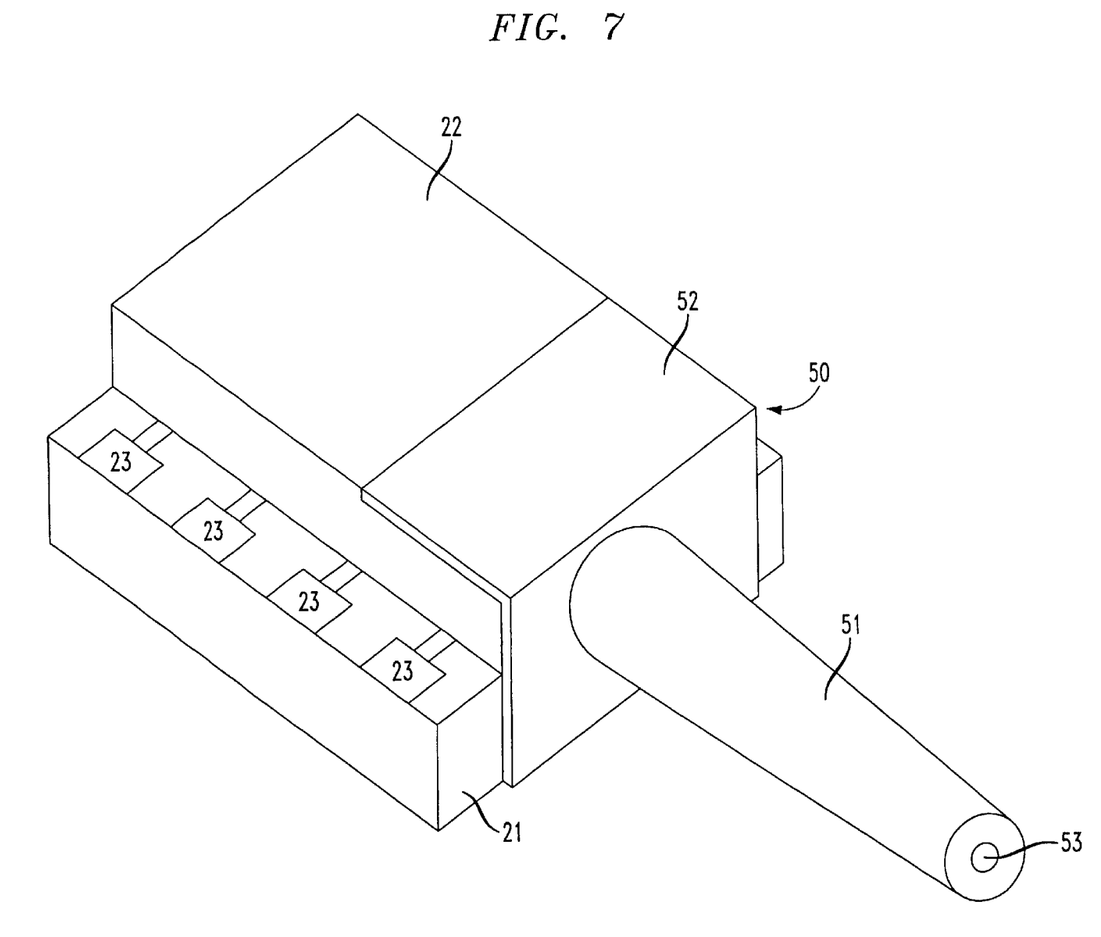
FIG. 7 illustrates and additional exemplary embodiment of the present invention.

In another embodiment of the present invention, a rigid optical transmission medium 50 may be affixed to the end of laser package 20, as shown in FIG. 7. The rigid optical transmission medium generally includes an L-shaped bracket 52 configured to receive the end of laser package 20 that emits laser light. A rigid tubular member 51 that is attached to L-shaped bracket may be used to communicate an optical signal generated by laser package 20 therethrough and release the optical signal via aperture 53. Alternatively, another optical transmission medium may be attached to the end of tubular member such that aperture 53 feeds the optical signal generated by laser package 20 into the optical transmission medium. Optical transmission medium may also be a semi-rigid or flexible optical transmission medium in this embodiment.

Figure 8:
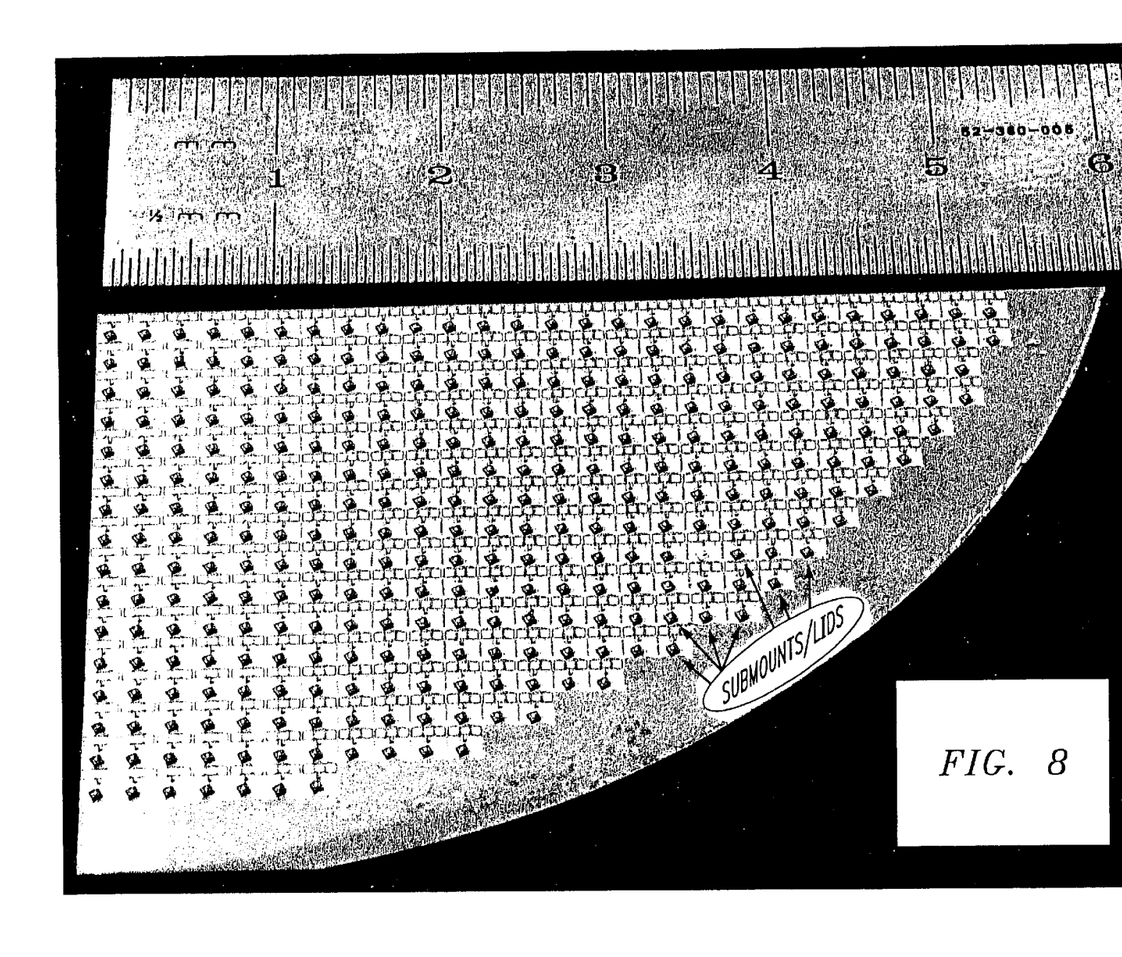
FIG. 8 illustrates an exemplary layout of a silicon wafer used to manufacture the present invention.

As noted above, submount 21 and lid 22 may be produced from silicon, and more particularly, from a standard 6-inch silicon wafer, for example, as silicon wafers are readily available at minimal cost. Therefore, given the compact size of laser package 20, which is approximately 4 mm×4 mm×1 mm, approximately one thousand submounts and lids may be produced from each a single 6-ince silicon wafer, as generally illustrated by FIG. 8. Assuming that laser package is manufactured from a standard 6-inch silicon wafer, the production of laser package 20 is generally a two step process, as both submount 21 and lid 22 are generally manufactured separately on separate silicon wafers. Manufacturing of submount 21 generally includes formation of the heater strips 33 and 35, and metallizing the necessary pads, lines, mounting locations, and mounting surfaces on a region of silicon wafer designated for manufacture of submount 21. If a wafer similar to that which is shown in FIG. 8 is used, then several hundred and even over one thousand submounts may be metallized in a single process, through, for example, a chemical or mechanical process calculated to generate the desired metallized surfaces.

Once submount 21 is manufactured, the respective optical components may be installed on the upper surface 26 of submount 21. The optical components may include a laser 37, a photo detector 38, and/or an optical fiber/transmission medium 40. The laser 37 and photo detector, which may have metallized under surfaces, may be soldered in their respective locations, which may also complete a first electrical connection with each of the components, assuming that a line 27 is in electrical connection with the metallized under surface when the respective component is mounted. A second electrical connection may be made to the respective optical components via an electrical jumper 39 installed to connect a second electrical connection of the respective components to a proximate line 27. Once the appropriate metallization and component installation process have been completed, the individual submounts 21 may be diced from the silicone wafer. Therefore, the plurality of individual submounts 21 shown in FIG. 8 on the single silicon wafer may be diced and separated into individual submounts separate from the remaining submounts. After the submounts are diced, an optical communication medium may be installed, such as the aforementioned fiber 40, for example. Fiber 40 may be placed in position, heater strip 35 activated, and solder 41 heated in order to fix fiber 40 in place. The installed optical components and jumpers 39 are shown in FIG. 4.

Lid 22 may also be manufactured from a standard silicon wafer, however, generally the only metallization generally required for lid 22 will be the region under solder 47, if desired for solder adhesion purposes. Lid 22 includes recessed portion 47 and a groove 24 that must be formed into the generally planar silicon wafer. In order to remove the appropriate material from the silicon wafer necessary to create recessed portion 47 and groove 24, a chemical etching-type process may be used. Alternatively, a mechanical process may be used to remove the unwanted silicon from the regions defining groove 24 and recessed region 47. Additionally, solder 47 may be placed around the perimeter of recessed portion 47 above the metallized region and along the outer length of each side of groove 24. Once the processes associated with lid 22 are completed, the silicon wafer containing the respective lids may be diced to generate a plurality of individual lids 22.

Once submount 21 and lid 22 are manufactured and have the appropriate optical components affixed thereto, lid 22 may be positioned on the upper surface 26 of submount 21. In positioning lid 22, the recessed region forms a hollow cavity immediately above the component placement area 34, which allows sufficient clearance for the optical components of laser package 20. Positioning of lid 22 over submount 21 may further include aligning the continuous bead of solder 47 on lid 22 with the metallized region above first strip heater 33 on submount 21. Therefore, a voltage may be applied to pads 32, which may act to increase the temperature of first heater strip 33 to the point where solder 47 melts. At this point the voltage may be discontinued and the first heater strip 33 and the solder 47 may cool to hermetically seal lid 22 to submount 21 via the respective metallized areas. However, the hermetic seal of lid 22 to submount is not complete, as the area surrounding fiber 40 in groove 24 is not sealed. Therefore, solder 48 may be placed in the area surrounding fiber 40 in order to fully seal the interior of laser package.

The assembled laser package 20 provides a compact laser package that offers substantially greater versatility over conventional devices. The laser package of the present invention is substantially smaller than conventional devices, and therefore, requires less material to manufacture, which reduces the cost. Additionally, as a result of the smaller package size, the compact laser package of the present invention much more versatile that conventional devices, as the laser package of the present invention may be mounted in a substantially smaller mounting location than conventional devices. Further, the compact laser of the present invention does not require a specified mounting receptacle, and a metallized under surface of the laser package allows the laser package of the present invention to be mounted in various locations on a electronic board. Additionally, the submount and lid portions of the present invention may be manufactured from standard silicon wafers, which reduces the manufacturing cost. Although the present invention discloses that the lid and submount portions are generally manufactured from separate silicon wafers, it is contemplated that the lid and submount components may be manufactured from a single waafer.

While foregoing is directed to the exemplary embodiments of the present invention, other additional embodiments of the present invention may be devised without departing from the true scope thereof, wherein the true scope of the present invention may be determined by reference to the metes and bounds of the following claims.

What is claimed is:

1. A compact laser package, comprising:
    a submount comprising at least one strip heater, a plurality of electrical contact pads and a plurality of electrical connection lines formed thereon, the submount being configured to receive at least one optical component thereon, the at least one optical component being in electrical communication with at least one of the plurality of electrical connection lines; and
    a lid comprising a recessed portion and a groove formed therein, the recessed portion being positioned in an interior of the lid and the groove being positioned to intersect the recessed portion and a peripheral edge of the lid, wherein said lid comprises a metallized region surrounding the periphery of the recessed portion and the groove, the metallized region having solder deposited thereon;
    wherein at least one of the at least one strip heater is configured to heat the solder positioned on the lid in order to seal the lid to the submount.

2. The compact laser package of claim 1, wherein the submount and lid are manufactured from a silicon wafer.

3. The compact laser package of claim 1, wherein the submount further comprises:
    a laser light emission device; and
    a photo detector device positioned proximate laser light emission device.

4. The compact laser package of claim 1, wherein the submount further comprises:
    an optical transmission medium mounting location.

5. The compact laser package of claim 4, wherein another of the at least one strip heaters is configured to heat solder positioned on the optical transmission medium mounting location in order to secure an optical transmission medium thereto.

6. The compact laser package of claim 1, wherein the submount includes a metallized under portion, the metallized under portion being configured to facilitate mounting of the compact laser package to a printed circuit board.

7. The compact laser package of claim 1, wherein the plurality of electrical contact pads are positioned about a periphery of the submount and are in electrical communication with the plurality of electrical connection lines extending into an interior region of the submount.

8. The compact laser package of claim 1, wherein said lid is hermetically sealed to the submount.

9. The compact laser package of claim 1, wherein a plurality of the submounts and a plurality of the lids are simultaneously manufactured on a single silicon wafer.

10. The compact laser package of claim 1, wherein the submount is substantially 4 mm in length, 4 mm in width, and 1 mm in height.

11. An miniature apparatus for generating laser light, the apparatus comprising:
    a silicon submount member comprising at least one strip heater;
    a silicon lid member, said lid member comprising a metallized region along its periphery, the metallized region having solder deposited thereon;
    at least one optical signal generation component positioned on the silicon submount member; and an optical transmission medium affixed to the silicon submount member, the optical transmission medium being configured to communicate a laser signal generated by the at least one optical signal generation component;

wherein at least one of the at least one strip heaters is configured to heat the solder positioned on the lid member in order to seal the lid member to the submount member.

12. The apparatus of claim 11, wherein the silicon submount member further comprises:

at least one electrical connection pad positioned about a periphery of the silicon submount;

a plurality of electrical connection lines extending from the electrical connection pad into an interior portion of the silicon submount;

a first strip heater positioned about a component placement region and being in electrical connection with two of the at least one electrical pads;

a metallized soldering region positioned above the first heater strip; and at least one optical component mounting location positioned in the component placement region, the at least one optical component mounting location being in proximity to at least one of the plurality of electrical connection lines.

13. The apparatus of claim 12, further comprising:

an optical fiber mounting location positioned in a component placement region;

a first electrical connection pad positioned on a first side of the optical fiber mounting location;

a second electrical pad positioned on a second side of the optical fiber mounting location; and a second strip heater in communication with the first and second electrical connection pads and being position under the optical fiber mounting location, wherein the second strip heater is configured to melt a portion of solder positioned on the optical fiber mounting location in order to secure an optical fiber thereto.

14. The apparatus of claim 11, wherein the silicon lid member further comprises:

a recessed region positioned in an interior portion of the lid member; and a groove formed to intersect the recessed region and a peripheral edge of the lid member;

wherein the lid member is hermetically sealed to the submount member.

15. The apparatus of claim 14, wherein the groove forms a triangular aperture with the submount member when lid member is affixed to submount member, the triangular aperture being configured to communicate an optical signal generated by the apparatus to an exterior of the apparatus.

16. The apparatus of claim 11, wherein the at least one optical signal generation component further comprises:

a laser light emission device; and a photo detector device.

17. The apparatus of claim 11, wherein the submount member is substantially 4 mm in length, 4 mm in width, and 1 mm in height.

18. The apparatus of claim 11, wherein a plurality of the submounts and a plurality of the lids are simultaneously manufactured on a single silicon wafer.

* * * * *